(12) United States Patent
Camacho et al.

(10) Patent No.: US 7,560,225 B2
(45) Date of Patent: Jul. 14, 2009

(54) METHOD OF FORMING UNIFORM FEATURES USING PHOTORESIST

(75) Inventors: Omar Eduardo Montero Camacho, Guadalajara (MX); Pei-C Chen, San Jose, CA (US); Cherngye Hwang, San Jose, CA (US); Diana Perez, San Jose, CA (US); Eric Yongjian Sun, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1062 days.

(21) Appl. No.: 10/448,501

(22) Filed: May 29, 2003

(65) Prior Publication Data

US 2004/0241593 A1 Dec. 2, 2004

(51) Int. Cl.
 *G03F 7/40* (2006.01)
 *B44C 1/22* (2006.01)
(52) U.S. Cl. .............. 430/322; 430/330; 430/323; 216/66
(58) Field of Classification Search .......... 430/322, 430/323, 330; 216/66
See application file for complete search history.

(56) References Cited

U.S. PATENT DOCUMENTS 5,329,689 A * 7/1994 Azuma et al. ............ 29/603.07
5,492,793 A    2/1996  Breyta et al.
5,516,430 A    5/1996  Hussinger
6,322,431 B1  11/2001  Schaenzer et al.
6,411,478 B1   6/2002  Mao et al.
6,416,935 B1 * 7/2002  Hsiao et al. ............. 430/320
6,503,406 B1   1/2003  Hsiao et al.
6,529,346 B2   3/2003  Otsuka
6,841,332 B2 * 1/2005  Falk et al. ............. 430/270.1
6,866,988 B2 * 3/2005  Lu et al. ................ 430/314

* cited by examiner

*Primary Examiner*—John A McPherson
*Assistant Examiner*—Daborah Chacko Davis
(74) *Attorney, Agent, or Firm*—G. Marlin Knight

(57) ABSTRACT

A process for ion milling using photoresist as a mask is described. In a preferred embodiment the invention is used in the fabricating air-bearing features on sliders for use in magnetic storage devices. According to the invention the photoresist (liquid or dry) is applied, developed and removed as in the prior art which includes baking steps. The embodiment of the invention includes an additional baking step beyond whatever baking steps are used in the photolithography process. The additional baking step is preferably performed immediately prior to ion milling. The additional baking step according to the invention yields increased uniformity of the depth of the ion milling which is believed to result from reduction of volatile material such as water in the photoresist. When the invention is used as part of the manufacturing process for ion milling the air-bearing features on a slider, the features are more uniform which improves the overall quality and performance.

8 Claims, 2 Drawing Sheets

METHOD OF FORMING UNIFORM FEATURES USING PHOTORESIST

FIELD OF THE INVENTION

The invention relates to the field of manufacturing processes using photoresist and ion milling and more particularly to methods using photoresist and ion milling to fabricate magnetic transducers (heads) and even more particularly to such methods as used to form features on the air-bearing surface of a slider containing magnetic transducers.

BACKGROUND OF THE INVENTION

In the typical manufacturing process for read/write heads for magnetic storage devices, a large number of sliders are fabricated from a single wafer having rows and columns of the magnetic transducers that are deposited simultaneously on a wafer surface using semiconductor-type process methods. In various process embodiments, further processing occurs after the wafer is sliced into quadrants and/or rows. In one embodiment the rows of magnetic heads are attached to a carrier with the transducers facing upward. The rows are then processed to form the air-bearing surface features and protective layers. Typically, a slider is formed with an aerodynamic pattern of protrusions (air-bearing features) on the air-bearing surface (ABS) which enable the slider to fly at a constant height close to the disk during operation of the disk drive. The recording density of a magnetic disk drive is limited by the distance between a transducer and the magnetic media. One goal of air-bearing slider design is to "fly" as closely as possible to the magnetic medium while avoiding excessive physical impact with the medium. Smaller spacing or "fly height" is desired so that the transducer can distinguish between the magnetic fields emanating from closely spaced regions on the disk. For more complex ABS patterns with multiple step levels, the lithography steps may be repeated. After all of the features have been formed, the row bars are separated with a diamond-cut saw into individual sliders, each having a magnetic head terminating at the ABS. It should be noted that the sliders are processed at the row level as a manufacturing convenience and that the sliders may also be cut from the row before processing.

Photolithography can be used in the process of forming the air-bearing features. Photoresist material comes in both liquid and dry forms. Either type of resist is applied and then exposed through a mask under high intensity light. In the liquid resist case the structure is then baked to stabilize the resist and to remove any residual solvent. In one process used by the applicants the exposed liquid resist is baked for approximately 30 minutes at about 100 degrees C. After exposure, the process of developing the image (positive or negative) in the photoresist removes the unwanted photoresist.

One method of forming air-bearing features uses a photoresist in conjunction with ion milling. The resist is exposed and developed to form a resist pattern covering the regions on the surface for the features (such as side-rails and the center rail) which will become the air-bearing features of the slider. The regions not covered by the resist pattern are etched by ion milling to form the features which protrude above the rest of the ABS surface. The resist pattern is then removed. A particular embodiment of a method for forming air-bearing features is described in U.S. Pat. No. 6,529,346 to Otsuka. A resist is applied on a carbon film that has been deposited over the surfaces of the transducers before the ion milling step.

In U.S. Pat. No. 6,503,406 to Hsiao, et al. the use of a temporary protective layer is described to prevent damage during the ABS patterning. During the etching process, the unmasked portion of the temporary protective coating is removed first, and the underlying area of the slider is then removed to a depth which is chosen to provide the desired flying characteristics for the slider. The remainder of the photoresist mask is then removed by a suitable solvent or by a soda blast.

In U.S. Pat. No. 6,322,431 Schaenzer, et al. ion milling of the photoresist patterned surface of burnishing heads is used to form surface features useful for burnishing. Burnishing heads contain no magnetic transducers.

In U.S. Pat. No. 6,411,478 to Mao, et al., a potential problem with the use of photoresist present during the formation of the tunnel barrier in a spin tunnel magnetic transducer is noted. The out-gasing from the photoresist is said to pollute the barrier material and degrade the barrier quality. To remedy this potential problem, a hard mask is suggested as a replacement for, or in addition to, the photoresist.

Applicants have found that the prior art methods using ion milling to form ABS features result in variations in the depth of material removed that are undesirable. Thus, there is a need for methods which reduce the variations in the depth of material removed by ion milling.

SUMMARY OF THE INVENTION

The invention is an improved process for ion milling using photoresist as a mask. In a preferred embodiment the invention is used in the manufacturing sliders for use in magnetic storage devices. According to the invention the photoresist (liquid or dry) is applied, developed and removed as in the prior art which includes baking steps. The embodiment of the invention includes an additional baking step beyond whatever baking steps are used in the photolithography process. The additional baking step is preferably performed close in time prior to ion milling. The method of the invention can be used with liquid or dry photoresist and with positive or negative photoresists. The additional baking step according to the invention yields increased uniformity of the depth of the ion milling which is believed to result from reduction of volatile material such as water in the photoresist. When the invention is used as part of the manufacturing process for ion milling the air-bearing features on a slider, the features are more uniform which improves the overall quality and performance.

DETAILED DESCRIPTION OF THE INVENTION AND THE PREFERRED EMBODIMENTS

The invention may be applied to any ion milling process which uses photoresist as a mask, since the additional bake step does not significantly alter the physical dimensions of the etched photoresist.

In the preferred embodiment of the invention, magnetic transducers are formed on the wafer in the conventional manner. For manufacturing efficiency the sliders are processed in batches. The features of the magnetic transducers do not affect the process of the invention; therefore, the invention can be used with any type of magnetic transducers. Ion milling is used in forming the air-bearing features on the sliders containing previously formed magnetic transducers. The sliders may be processed at the row level or the sliders may be individually sliced prior to forming the air-bearing features. The batches of sliders are typically run through a series of machines by operators working in a clean room environment. The air-bearing features on the sliders are defined by a standard positive photoresist process using either dry or liquid photoresist. The liquid photoresist process includes the standard baking step after the liquid is applied. A standard bake for the liquid photoresist would be approximately 30 minutes at 95 degrees C. The dry photoresist process does not include bake steps. The photoresist is exposed through a mask that defines areas on the substrate surface that are to be protected from ion milling. The developing of the exposed photoresist removes the resist from the areas where ion milling is desired.

Figure 1:
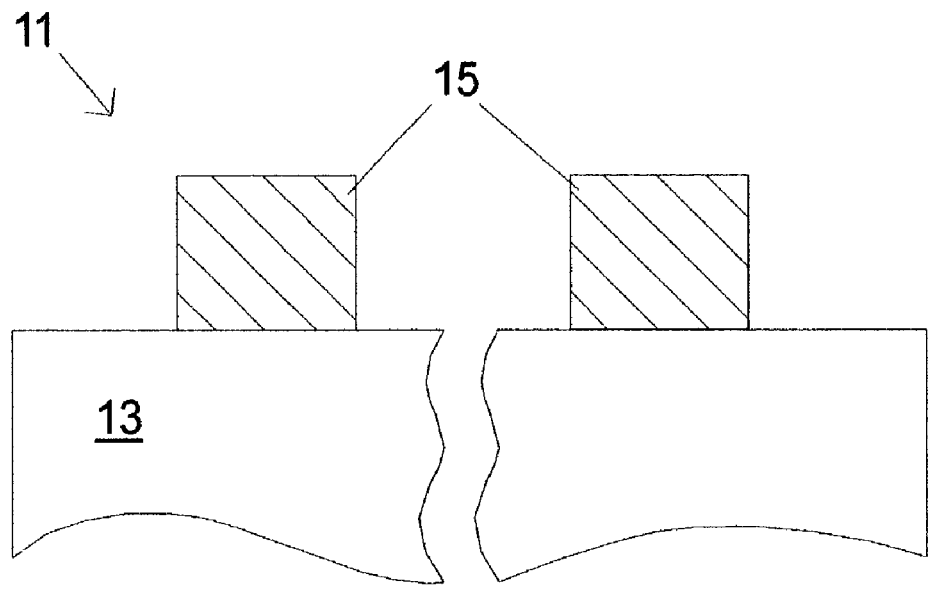
FIG. 1 illustrates photoresist pads on a substrate surface according to the prior art.

FIG. 1 illustrates a section of a slider 11 which is part of a larger batch of sliders attached to a carrier (not shown) that is used to support and transport the batch of sliders. The slider substrate 13 is typically made of a durable material such as $Al_2O_3$/TiC. The stage of processing shown is after the slider emerges from the final part of the photolithographic process which defines the contours of the air-bearing features on the slider surface. The resist pads 15 have been formed in a plan view (not shown) of the air-bearing features by the standard photolithographic process to protect the surface under them during the ion milling. The thickness and width of the resist pads is not critical, but the thickness must be sufficient for the pads to protect the underlying surface during the ion milling process. As an example, resist pads on the order of 25 microns thick are typically adequate. The features, typically called rails and pads, on an ABS for a typical magnetic storage device are relatively large compared to those in semiconductor devices. For example, a commercially available slider at the present time is on the order of 1 millimeter wide and a typical rail is approximately 300 microns wide. These values are given as being indicative of a type of commercial slider being manufactured at the time of this application, but should not be taken as a limitation on the scope of the invention. As is well known, the dimensions of components for disk drives have been going down for decades and can be expected to continue to do so in the future.

The applicants have discovered that the addition of a substantial baking period prior to ion milling unexpectedly results in an improvement in the uniformity of the ion milling. One reason that this result is unexpected is that the air-bearing slider features may be separated by spaces on the order of a 0.5 millimeters which is approximately 20 times the thickness of the pads. It is, of course, the space between the pads that is subject to ion milling.

The length and temperature of the baking is determined empirically for the particular combination of resist type and process. Applicants have found that baking for 15 minutes with a selected temperature from 60 to 70 degrees C. achieves substantially improved etch uniformity for both dry and liquid resist in a particular embodiment of a slider air-bearing feature fabrication line. Other time lengths and temperatures may be empirically determined for other combinations of equipment, etc. The upper temperature limit is determined by the point at which the particular resist material or some other component will be damaged or dimensionally altered. Lower temperatures will tend to increase the time required for baking. The use of a vacuum oven is preferred for the baking step to keep contamination to a minimum. The sliders can allowed to cool in the clean room air after baking. The ion milling process should be performed within a selected time window after the baking step, since the risk exists that even in a clean room environment the moisture level in the resist will increase over time. The applicants have empirically found that allowing a maximum time of 1.5 hours after baking when the ion milling must be performed is adequate to ensure the improved results. Other time windows may be adequate for other combinations of equipment, etc.

Figure 2:
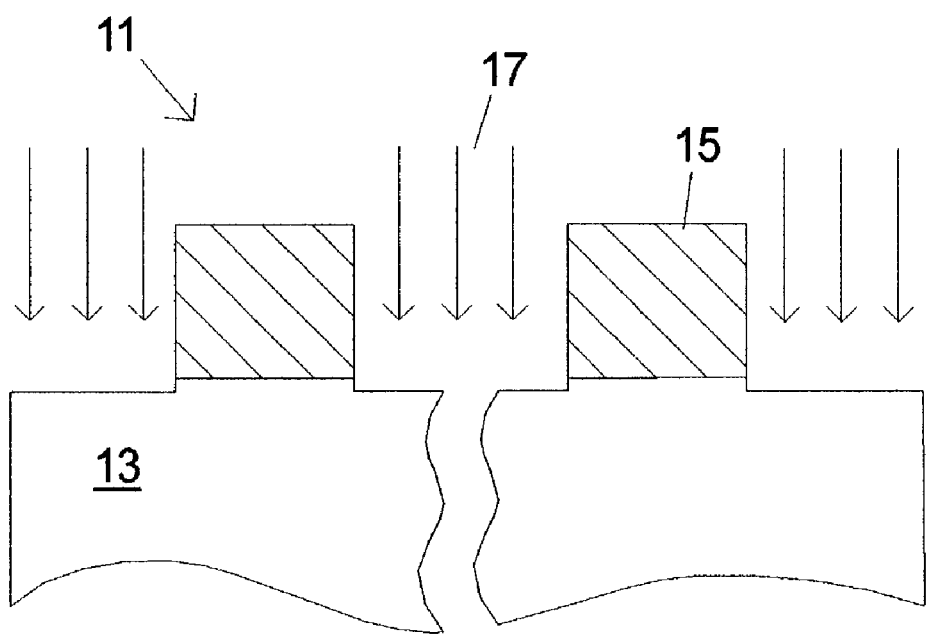
FIG. 2 illustrates the process of ion milling the substrate surface using the photoresist pads which have been baked according to the invention.
Figure 3:
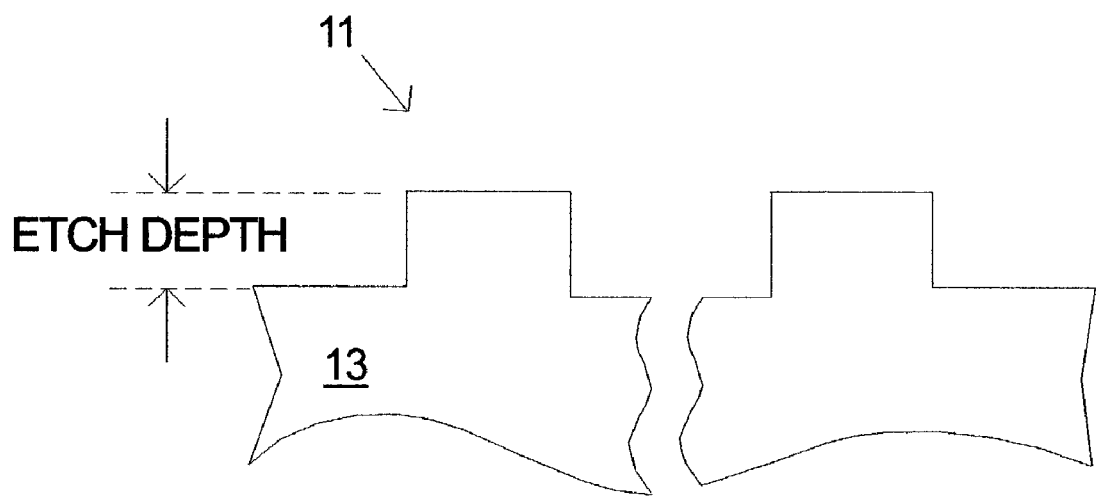
FIG. 3 illustrates the etch depth measurement after ion milling the substrate surface using the photoresist pads which have been baked according to the invention.

Ion milling is performed according to the prior art using argon. The ion milling is illustrated in FIG. 2 which shows a preferred, substantially perpendicular incidence of the beams 17 which remove material from the exposed surface of the substrate 13. The photoresist material is also etched, but since the photoresist material is temporary this is insignificant. The photoresist material is actually etched at a faster rate than the substrate surface, so the resist needs to be significantly thicker than the desired etch depth for the substrate. For current slider air-bearing features the etch depth into the substrate is about 0.2 microns, but no limitation on the etch depth is inherent in the process according to the invention. FIG. 3 shows the slider 11 after the ion milling has been completed and the photoresist material has been removed. The etch depth is the difference between the original substrate surface and the surface of the etched areas.

In order to measure the etch uniformity, a set of measurements are made using selected points on the batch of sliders in a run. In the data presented below, the applicants selected approximately 1000 points on each batch of sliders.

In a test performed by the applicants both liquid and dry photoresist were used. The run-to-run etch uniformity, as well as, the overall batch uniformity was measured. The data are presented in Tables 1 and 2. When liquid resist was used, the run-to-run etch uniformity (3 sigma) was found to be 5.5% by the prior art process. The addition of the bake step according to the invention lowered the variation to 2.1%, i.e., an improvement of 2.6×. The overall batch etch variation went from 6.5% using the prior art process to 4.5% using the process of the invention for an improvement of 1.4×. The run-to-run improvement is a better measure of the ion milling process uniformity, since other process variables affect the overall batch uniformity to a greater degree.

TABLE 1

Etch Uniformity with Liquid Resist

|  | Prior art | Bake per Invention | Improvement |
| --- | --- | --- | --- |
| Run-to-Run | 5.5% | 2.1% | 2.6× |
| Overall | 6.5% | 4.5% | 1.4× |

TABLE 2

Etch Uniformity with Dry Resist

|  | Prior art | Bake per Invention | Improvement |
| --- | --- | --- | --- |
| Run-to-Run | 2.5% | 1.1% | 2.3× |
| Overall | 4.5% | 3.5% | 1.3× |

When dry resist was used (Table 2), the run-to-run etch uniformity (3 sigma) was found to be 2.5% by the prior art process. The addition of the bake step according to the invention lowered the variation to 1.1%, i.e., an improvement of 2.3×. The overall batch etch variation went from 4.5% using the prior art process to 3.5% using the process of the invention for an improvement of 1.3×.

Although measurements of the water or other volatile substances in the resists were not made, it is believed that the improvement is due to reduction of volatile substances such as moisture that out gas during the ion milling.

The invention has been described by reference to an embodiment which should not be taken as a limitation of the invention. Those skilled in the art will recognize variations and equivalents that will nevertheless be within the scope of the invention.

What is claimed is:

1. A method of ion milling comprising the steps of:
    depositing a photoresist material on a substrate surface in a liquid form;
    baking the photoresist material prior to an exposing step;
    exposing the photoresist material through a mask that defines first and second features on the substrate surface to be protected from ion milling, the first and second features being separated by a distance that is greater than a thickness of the photoresist material;
    developing the photoresist material to remove photoresist material from selected area on the substrate surface between the first and second features while leaving the photoresist material on the first and second features;
    baking the photoresist material, after the developing step, on the substrate surface at an elevated temperature for a selected time period;
    ion milling the selected area on the substrate surface not covered by photoresist material to remove substrate material to a selected etch depth; and
    removing all photoresist material from the substrate surface.

2. The method of claim 1 wherein the distance between the first and second features is more than ten times greater than the thickness of the photoresist material.

3. A method of forming air-bearing features on a slider comprising the steps of:
    depositing a photoresist material on a slider surface in a liquid form;
    baking the photoresist material prior to an exposing step;
    exposing the photoresist material through a mask that defines a first area as a plan view of the air-bearing features on the slider surface to be protected from ion milling, a distance between two air-bearing features being greater than a thickness of the photoresist material;
    developing the photoresist material to remove photoresist material from a second area on the slider surface selected for ion milling while leaving the photoresist material on the first area of the slider surface;
    baking the photoresist material, after the developing step, on the first area of the slider surface at an elevated temperature for a selected time period;
    ion milling the second area on the slider surface not covered by photoresist material to remove substrate material to a target etch depth; and
    removing all photoresist material from the slider surface exposing the air-bearing features.

4. The method of claim 3 wherein the distance between two air-bearing features is more than ten times greater than the thickness of the photoresist material.

5. The method of claim 3 further comprising the steps of:
    after removing all photoresist material, measuring an actual etch depth at selected points on the slider surface; and
    computing a value representative of the uniformity of the actual etch depth.

6. A method of forming air-bearing features on a slider comprising the steps of:
    depositing a photoresist material on a slider surface;
    exposing the photoresist material through a mask that defines a first area as a plan view of the air-bearing features on the slider surface to be protected from ion milling, wherein a distance between two air-bearing features is greater than a thickness of the photoresist material;
    developing the photoresist material to remove photoresist material from a second area on the slider surface selected for ion milling while leaving the photoresist material on the first area of the slider surface;
    baking the photoresist material, after the developing step, on the first area of the slider surface at an elevated temperature for a selected time period;
    ion milling the second area on the slider surface not covered by photoresist material to remove substrate material to a target etch depth; and
    removing all photoresist material from the slider surface exposing the air-bearing features.

7. The method of claim 6 wherein the photoresist material is applied in a liquid form and the method further comprises the step of baking the photoresist material prior to the exposing step.

8. The method of claim 6 wherein the distance between two air-bearing features is more than ten times greater than the thickness of the photoresist material.

* * * * *